(12) United States Patent
Zhang

(10) Patent No.: US 8,576,030 B2
(45) Date of Patent: Nov. 5, 2013

(54) SWITCH MODULE FOR ACTIVATING A HIBERNATION MODE OF AN ELECTRONIC DEVICE AND ELECTRONIC DEVICE THEREWITH

(75) Inventor: Manli Zhang, New Taipei (TW)

(73) Assignee: Wistron Corporation, Hsichih, New Taipei (TW)

(*) Notice: Subject to any disclaimer, the term of this patent is extended or adjusted under 35 U.S.C. 154(b) by 0 days.

(21) Appl. No.: 13/612,815

(22) Filed: Sep. 12, 2012

(65) Prior Publication Data
US 2013/0265123 A1  Oct. 10, 2013

(30) Foreign Application Priority Data
Apr. 10, 2012 (CN) .......................... 2012 1 0103982

(51) Int. Cl.
*H01H 9/00* (2006.01)
(52) U.S. Cl.
USPC .......................................... 335/205; 335/207
(58) Field of Classification Search
USPC ....................................................... 335/205
See application file for complete search history.

(56) References Cited

U.S. PATENT DOCUMENTS

| | | | | |
|---|---|---|---|---|
| 3,209,097 | A * | 9/1965 | Shlesinger, Jr. | 335/207 |
| 4,332,987 | A * | 6/1982 | Hoffman | 200/16 D |
| 5,434,602 | A * | 7/1995 | Kaburagi et al. | 346/139 R |
| 5,588,757 | A * | 12/1996 | Unosawa et al. | 400/279 |
| 5,779,367 | A * | 7/1998 | Obara | 384/8 |
| 5,945,824 | A * | 8/1999 | Obara et al. | 324/207.22 |
| 6,148,714 | A * | 11/2000 | Abe et al. | 92/88 |
| 6,308,431 | B1 * | 10/2001 | Takanashi et al. | 33/708 |
| 6,929,291 | B2 * | 8/2005 | Chen | 292/251.5 |
| 7,187,976 | B2 * | 3/2007 | Duncan et al. | 607/43 |
| 2006/0114221 | A1 * | 6/2006 | Sakurai et al. | 345/156 |
| 2007/0002488 | A1 * | 1/2007 | Kato | 360/85 |
| 2007/0133156 | A1 * | 6/2007 | Ligtenberg et al. | 361/681 |
| 2007/0138806 | A1 * | 6/2007 | Ligtenberg et al. | 292/251.5 |

* cited by examiner

*Primary Examiner* — Elvin G Enad
*Assistant Examiner* — Lisa Homza
(74) *Attorney, Agent, or Firm* — Winston Hsu; Scott Margo

(57) ABSTRACT

A switch module for activating a hibernation mode of an electronic device is disclosed. The electronic device includes a casing and a hibernation switch installed inside the casing. The switch module includes a sliding member, a push button and an activating member. The sliding member is disposed on an inner side of the casing in a slidable manner. The push button is slidably disposed on an outer side of the casing and connected to the sliding member for driving the sliding member to slide relative to the casing. The activating member is disposed on the sliding member for activating the hibernation switch when the push button drives the sliding member to slide to an activating position, so as to activate the hibernation mode of the electronic device.

14 Claims, 9 Drawing Sheets

SWITCH MODULE FOR ACTIVATING A HIBERNATION MODE OF AN ELECTRONIC DEVICE AND ELECTRONIC DEVICE THEREWITH

BACKGROUND OF THE INVENTION

1. Field of the Invention

The present invention relates to a switch module and an electronic device therewith, and more particularly, to a switch module for activating a hibernation mode of an electronic device and an electronic device therewith.

2. Description of the Prior Art

Generally speaking, a notebook computer is equipped with a hibernation module for turning off a display module of the notebook computer. For example, when the notebook computer idles for a period of time, a hibernation mode of the notebook computer can activated by the aforesaid hibernation module for saving system resource or reducing power consumption. Alternatively, when a user temporarily leaves the notebook computer, the hibernation mode of the notebook can be activated, such that the display module hibernates so as to prevent others from watching ongoing data on the display module.

A conventional hibernation module includes a magnet disposed inside a display casing of the notebook computer and a hall sensor disposed inside a host casing of the notebook computer. When the display casing pivots relative to the host casing to a position where the hall sensor inside the host casing senses magnetic force generated by the magnet inside the display casing, the hibernation module can activate the hibernation mode of the notebook computer, so as to turn off the display module. However, since the display casing is smaller than the host casing of the notebook computer, the mechanical space inside the display casing is smaller than the mechanical space inside the host casing. Accordingly, the mechanical space inside the display casing will constrain the volume of the magnet, so as not to generate sufficient magnetic force. In other words, when the user wants to turn on the hibernation mode of the notebook computer, the display casing needs to be turned by a specific angle to relatively approach the host casing, such that the magnet inside the display casing is capable of activating the hall sensor inside the host casing. As a result, it causes inconvenience in use and reduces flexibility of the hibernation module.

SUMMARY OF THE INVENTION

Thus, the present invention provides a switch module for activating a hibernation mode of an electronic device and an electronic device therewith for solving above drawbacks.

According to the claimed invention, a switch module for activating a hibernation mode of an electronic device is disclosed. The electronic device includes a casing and a hibernation switch installed inside the casing. The switch module includes a sliding member, a push button and an activating member. The sliding member is disposed on an inner side of the casing in a slidable manner. The push button is slidably disposed on an outer side of the casing and connected to the sliding member. The push button is for driving the sliding member to slide relative to the casing. The activating member is disposed on the sliding member for activating the hibernation switch when the push button drives the sliding member to slide to an activating position, so as to activate the hibernation mode of the electronic device.

According to the claimed invention, at least one sliding slot with an orientation parallel to a first direction is formed on the casing, and an engaging slot is formed on the sliding member. The push button includes a button body and at least one engaging member. The button body is slidably disposed on the outer side of the casing. The at least one engaging member is connected to the button body and disposed through the at least one sliding slot. The at least one engaging member is for engaging the engaging slot on the sliding member and for driving the sliding member to slide relative to the casing in the first direction or in a second direction opposite to the first direction as sliding inside the at least one sliding slot.

According to the claimed invention, the push button further includes a sliding rib disposed on the button body and slidably abutting against the casing.

According to the claimed invention, the casing includes a first constraining portion and a second constraining portion. The switch module further includes a protruding structure and a resilient structure. The protruding structure is for selectively engaging the first constraining portion or the second constraining portion. The resilient structure is resiliently connected to the sliding member and the protruding structure for driving the protruding structure to engage the first constraining portion or the second constraining portion when the sliding member correspondingly slides relative to the casing to a non-activating position or to the activating position.

According to the claimed invention, the activating member is a magnetic member, and the hibernation switch is a hall sensor for sensing magnetic force generated by the magnetic member when the sliding member slides to the activating position, so as to activate the hibernation mode of the electronic device.

According to the claimed invention, the switch module further includes a fixing structure disposed on the sliding member for fixing the activating member on the sliding member.

According to the claimed invention, the fixing structure includes a first wall, a second wall, a third wall and a hook member. The first wall protrudes from the sliding member for stopping the activating member from moving relative to the sliding member in a third direction. The second wall protrudes from the sliding member for stopping the activating member from moving relative to the sliding member in a fourth direction. The third wall protrudes from the sliding member. The hook member is connected to the first wall and the second wall. The hook member and the third wall are cooperatively for stopping the activating member from moving relative to the sliding member in the first direction or in the second direction, and the hook member is further for preventing the activating member from separating from the sliding member.

According to the claimed invention, the switch module further includes an opening structure formed on the sliding member with a periphery respectively connected to the first wall, the second wall and the third wall. The periphery of the opening structure abuts against the activating member, so as to fix the activating member on the sliding member cooperatively with the fixing structure.

According to the claimed invention, the third direction is substantially perpendicular to the first direction and the second direction, and the fourth direction is opposite to the third direction.

According to the claimed invention, the activating member and the sliding member are integrally formed, and the hibernation switch is a contact switch. The activating member is for pressing the contact switch when the sliding member slides to the activating position, so as to activate the hibernation mode of the electronic device.

According to the claimed invention, an electronic device includes a casing, a hibernation switch and a switch module. The hibernation switch is installed inside the casing for activating a hibernation mode of the electronic device. The switch module is for activating the hibernation switch and includes a sliding member, a push button and an activating member. The sliding member is disposed on an inner side of the casing in a slidable manner. The push button is slidably disposed on an outer side of the casing and connected to the sliding member. The push button is for driving the sliding member to slide relative to the casing. The activating member is disposed on the sliding member for activating the hibernation switch when the push button drives the sliding member to slide to an activating position, so as to activate the hibernation mode of the electronic device.

In summary, since the switch module of the present invention disposes the hibernation switch for activating the hibernation mode of the electronic device and the activating member for activating the hibernation switch inside the same casing, such as inside a host casing, the switch module of the present invention is not constrained by mechanical space of a display casing. In addition, the present invention utilizes the sliding member to move the activating member to the activating position for activating the hibernation switch. Since the sliding design of the sliding member is capable of moving the activating member to the activating position more precisely, the switch module of the present invention is capable of enhancing stability. When the hibernation mode of the electronic device is desired to be turned on, the push button is used for driving the sliding member to slide to the activation position, such that the activating member activates the hibernation switch. As a result, the switch module of the present invention is capable of enhancing convenience in use and flexibility of the product.

These and other objectives of the present invention will no doubt become obvious to those of ordinary skill in the art after reading the following detailed description of the embodiment that is illustrated in the various figures and drawings.

DETAILED DESCRIPTION

Figure 1:
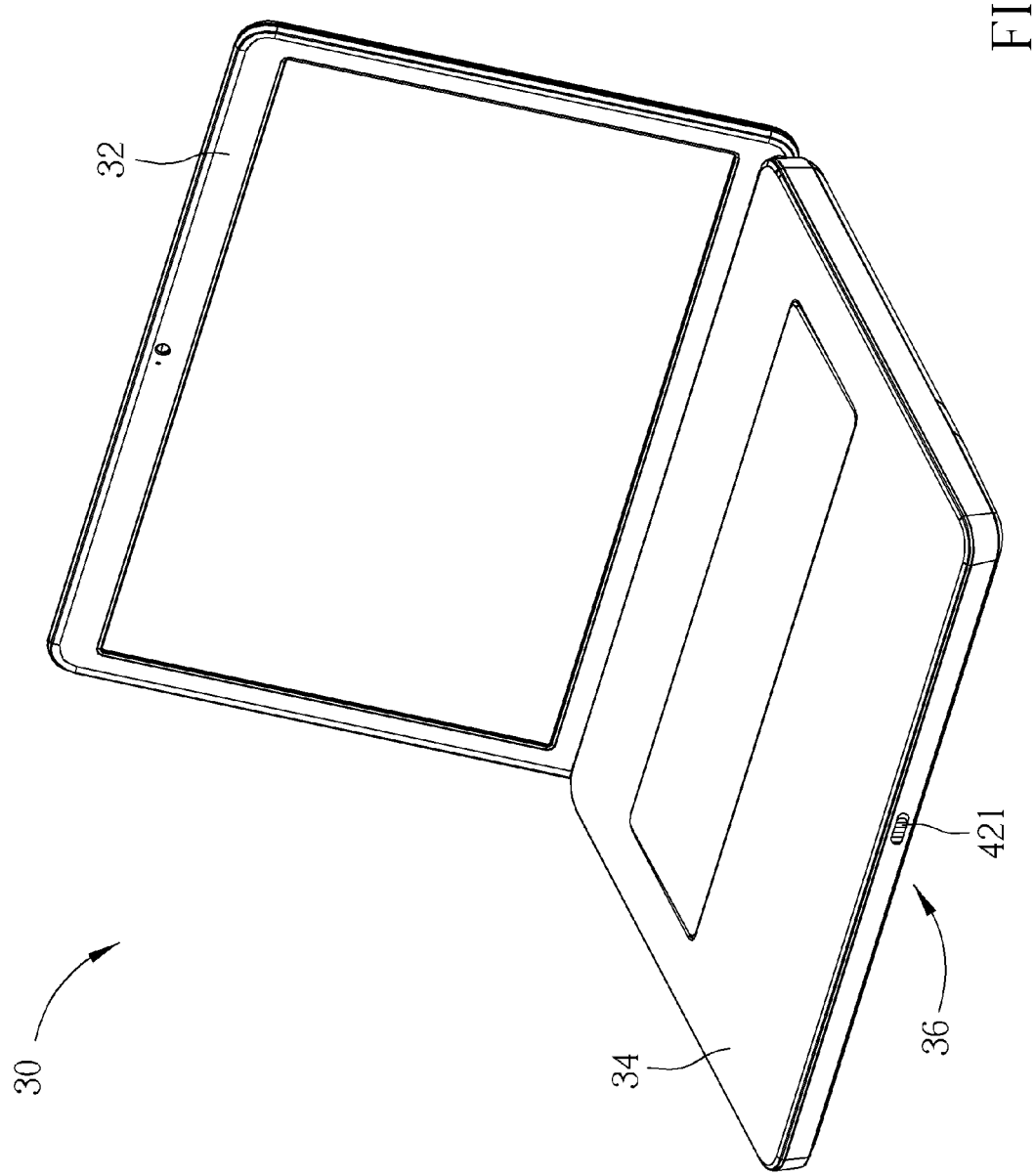
FIG. 1 is a schematic diagram of an electronic device according to an embodiment of the present invention.

Please refer to FIG. 1. FIG. 1 is a schematic diagram of an electronic device 30 according to an embodiment of the present invention. As shown in FIG. 1, the electronic device 30 includes a display casing 32 and a casing 34. The display casing 32 is pivoted to the casing 34. In this embodiment, the electronic device 30 can be a notebook computer. The display casing 32 is used for enclosing a display module, a backlight module of the notebook computer and so on. The casing 34 is used for enclosing a main board, an optical disc drive of the notebook computer and so on. When the electronic device 30 is in use, the display casing 32 can be pivoted relative to the casing 34 to be in an opened status, such that a user can operate the electronic device 30. When the electronic device 30 is not in use, the display casing 32 can be pivoted relative to the casing 34 to be in a closed status, such that the user can carry or contain the electronic device 30.

Figure 2:
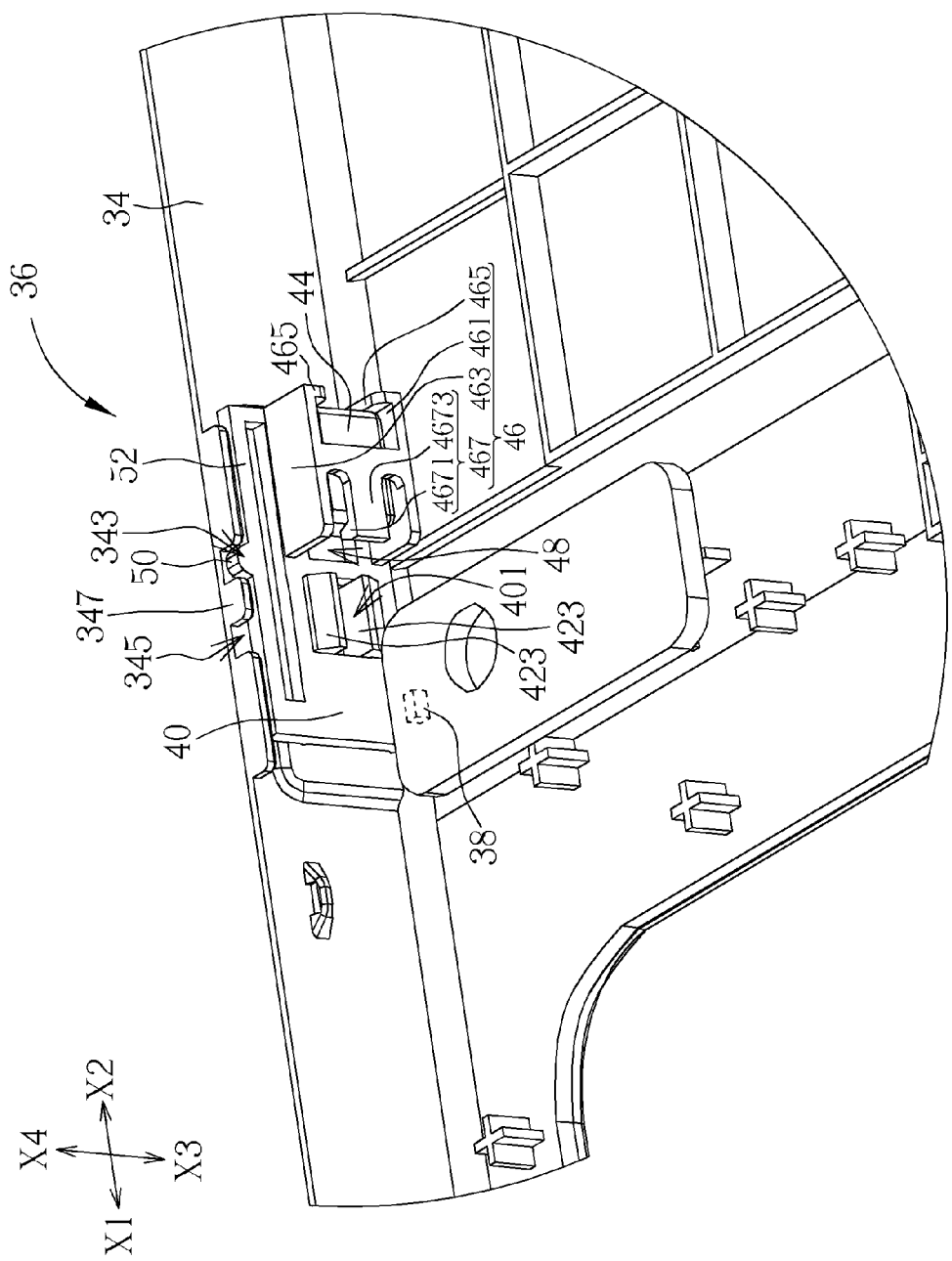
FIG. 2 is an assembly diagram of a casing and a switch module according to the embodiment of the present invention.
Figure 3:
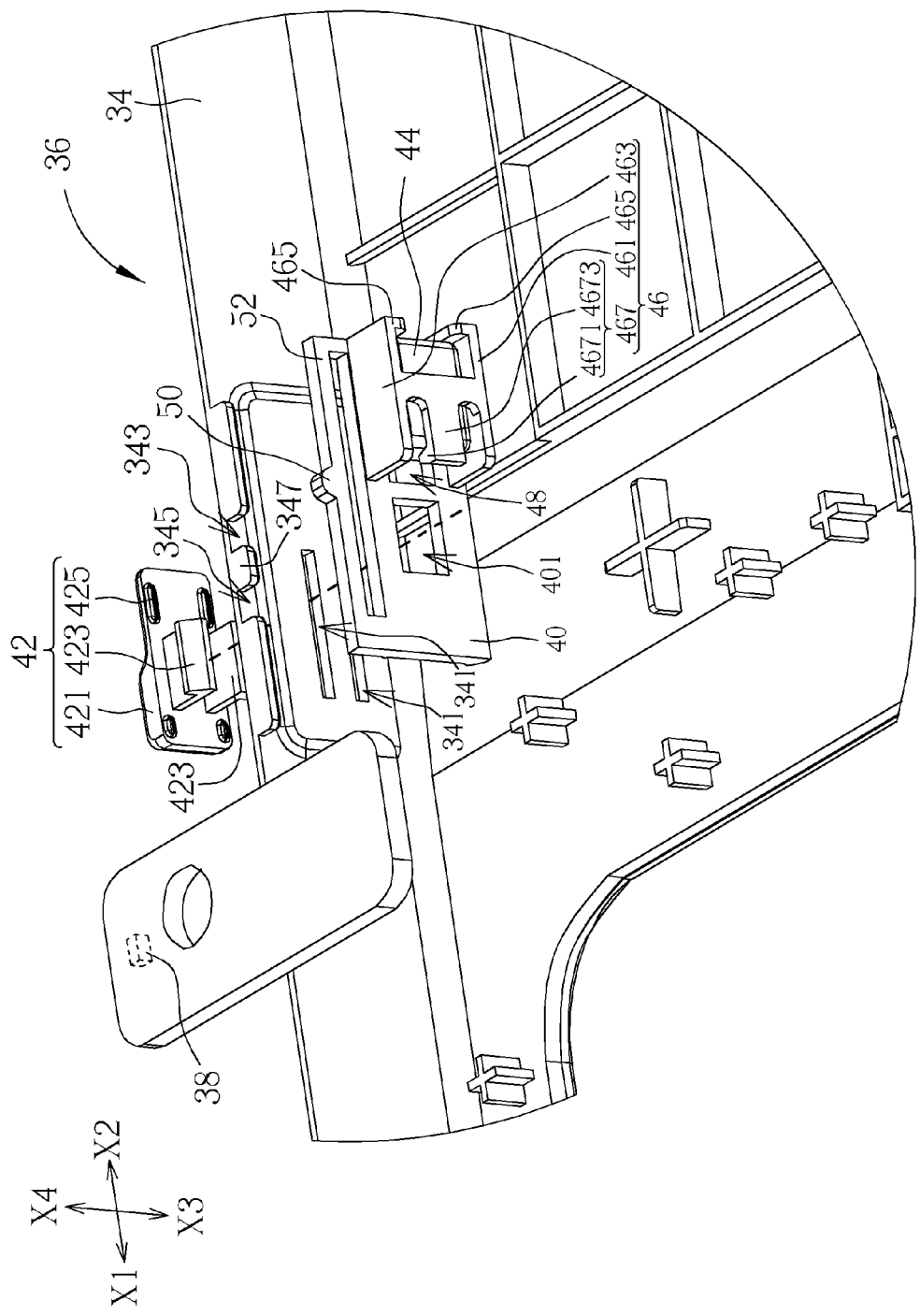
FIG. 3 is an exploded diagram of the casing and the switch module according to the embodiment of the present invention.

In addition, the electronic device 30 further includes a switch module 36 installed on the casing 34. Please refer to FIG. 1 to FIG. 3. FIG. 2 is an assembly diagram of the casing 34 and the switch module 36 according to the embodiment of the present invention. FIG. 3 is an exploded diagram of the casing 34 and the switch module 36 according to the embodiment of the present invention. As shown in FIG. 1 to FIG. 3, the electronic device 30 further includes a hibernation switch 38 installed inside the casing 34 and located near the switch module 36. The switch module 36 is used for activating the hibernation switch 38, such that the hibernation switch 38 activates a hibernation mode of the electronic device 30. Accordingly, a display module installed on the display casing 32 of the electronic device 30 hibernates. When the user utilizes the electronic device 30 to deal with personal affairs, the electronic device 30 can activate the hibernation mode by utilizing the switch module 36 and the hibernation switch 38, so as to save system resource, reduce power consumption or prevent others from watching ongoing data operated by the electronic device 30.

As shown in FIG. 2 and FIG. 3, a sliding slot 341 with an orientation parallel to a first direction X1 is formed on the casing 34. The switch module 36 includes a sliding member 40 and a push button 42. The sliding member 40 is disposed on an inner side of the casing 34 in a slidable manner, and the push button 42 is slidably disposed on an outer side of the casing 34 and connected to the sliding member 40. Additionally, an engaging slot 401 is formed on the sliding member 40, and the push button 42 includes a button body 421 and an engaging member 423. The button body 421 is slidably disposed on the outer side of the casing 34, and the engaging member 423 is connected to the button body 421 and disposed through the sliding slot 401 on the sliding member 40. The button body 421 provides a point of force application, such that the user can drive the sliding member 40 to slide relative to the casing 34 by pushing of the button body 421 of the push button 42 as well as engagement of the engaging member 423 and the engaging slot 401. In this embodiment, the engaging member 423 can be a hook.

When the push button 42 is assembled with the sliding member 40, the push button 42 can be installed from the outer side of the casing 34 onto the casing 34. In the meanwhile, the button body 421 of the push button 42 is exposed on the casing 34, as shown in FIG. 1, and the engaging member 423 of the push button 42 is disposed through the sliding slot 341 on the casing 34. Afterwards, the engaging slot 401 on the sliding member 40 is engaged with the engaging member 423 of the push button 42 on the inner side of the casing 34. In such a manner, the button body 421 of the push button 42 and the sliding member 40 can be located on the outer side and the inner side of the casing 34, respectively. In the meanwhile, the engaging member 423 of the push button 42 can be used for sliding along the sliding slot 341 on the casing 34. Since the orientation of the sliding slot 341 is parallel to the first direction X1, the sliding slot 341 can constrain a sliding direction of the sliding member 40 when the button body 421 is pushed to drive the engaging member 423 to slide the sliding member 40 relative to the casing 34. In other words, the sliding slot 341 can constrain the sliding member 40 to slide in the first direction X1 or in a second direction X2 opposite to the first direction X1.

In this embodiment, the push button 42 can include two engaging members 423 disposed on two sides of the button body 421. Two sliding slots 341 are formed on the casing 34 corresponding to the two engaging members 423, such that the two engaging members 423 can respectively pass through the two sliding slots 341 to engage the engaging slots 401. Accordingly, the push button 42 can be engaged with the sliding member 40 more firmly and drive the sliding member 40 to slide relative to the casing 34 more effectively. Amounts and disposal positions of the engaging member 423 and the sliding slot 341 are not limited to those mentioned in this embodiment. For example, the push button 42 can include one engaging member 423 disposed on a middle portion of the button body 421, and one sliding slot 341 is formed on the casing 34 corresponding to the one engaging member 423. In other words, the structures including at least one engaging member 423 and at least one sliding slot 341 are within the scope of the present invention.

Figure 4:
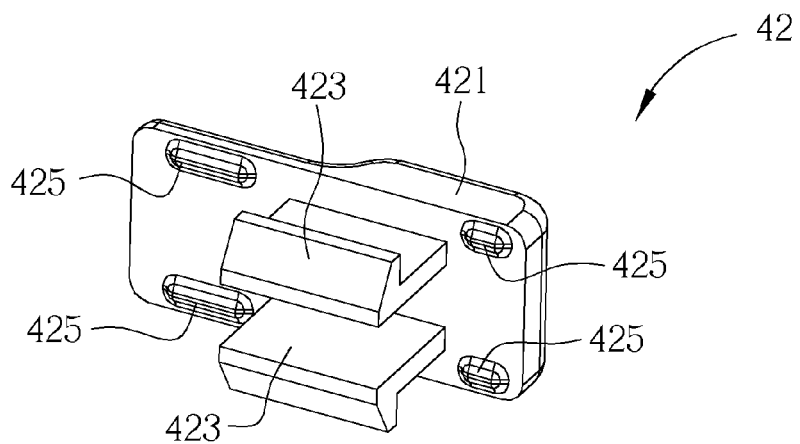
FIG. 4 is a diagram of a push button in another view according to the embodiment of the present invention.

Please refer to FIG. 4. FIG. 4 is a diagram of the push button 42 in another view according to the embodiment of the present invention. As shown in FIG. 4, the push button 42 further includes four sliding ribs 425 respectively disposed on four corners of a side, which faces the casing 34, of the button body 421. The sliding ribs 425 slidably abut against the casing 34 for reducing friction occurring when the button body 421 slides relative to the casing 34. In other words, the sliding ribs 425 make sliding contact between the button body 421 and the casing 34 be a linear-typed contact instead of a surface-typed contact. Accordingly, it can reduce the friction occurring when the button body 421 slides relative to the casing 34, so as to enhance life of the push button 42.

Figure 5:
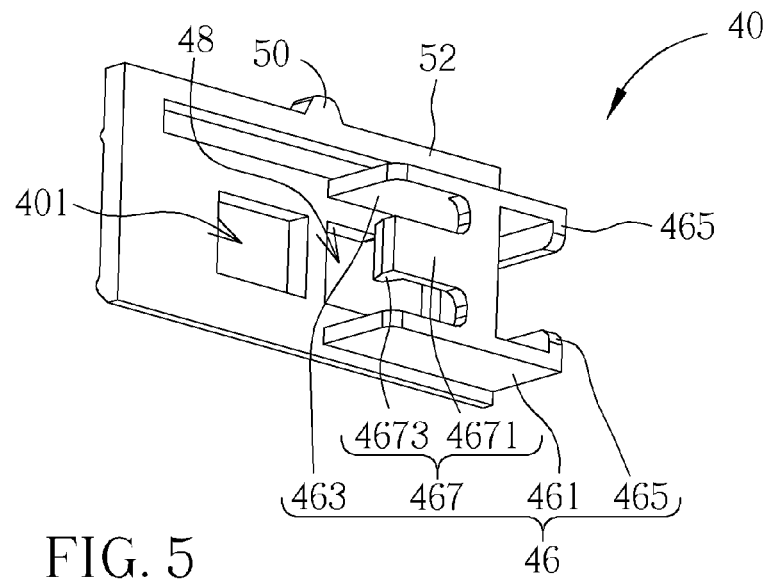
FIG. 5 and FIG. 6 are respectively diagrams of a sliding member in different views according to the embodiment of the present invention.
Figure 6:
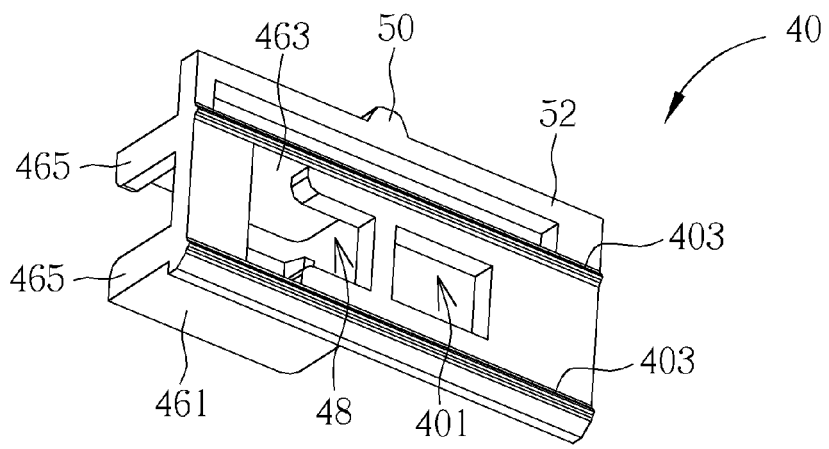

Please refer to FIG. 5 and FIG. 6. FIG. 5 and FIG. 6 are respectively diagrams of the sliding member 40 in different views according to the embodiment of the present invention. As shown in FIG. 5 and FIG. 6, the sliding member 40 further includes two sliding ribs 403 respectively disposed on two lateral sides of a side, which faces the casing 34, of the sliding member 40. The sliding ribs 403 slidably abut against the casing 34 for reducing friction occurring when the sliding member 40 slides relative to the casing 34. In other words, the sliding ribs 403 make sliding contact between the sliding member 40 and the casing 34 be a linear-typed contact instead of a surface-typed contact. Accordingly, it can reduce the friction occurring when the sliding member 40 slides relative to the casing 34, so as to enhance life of the sliding member 40. Amounts and disposal positions of the sliding ribs 425, 403 are not limited to those mentioned in this embodiment, and it depends on practical demands.

Figure 7:
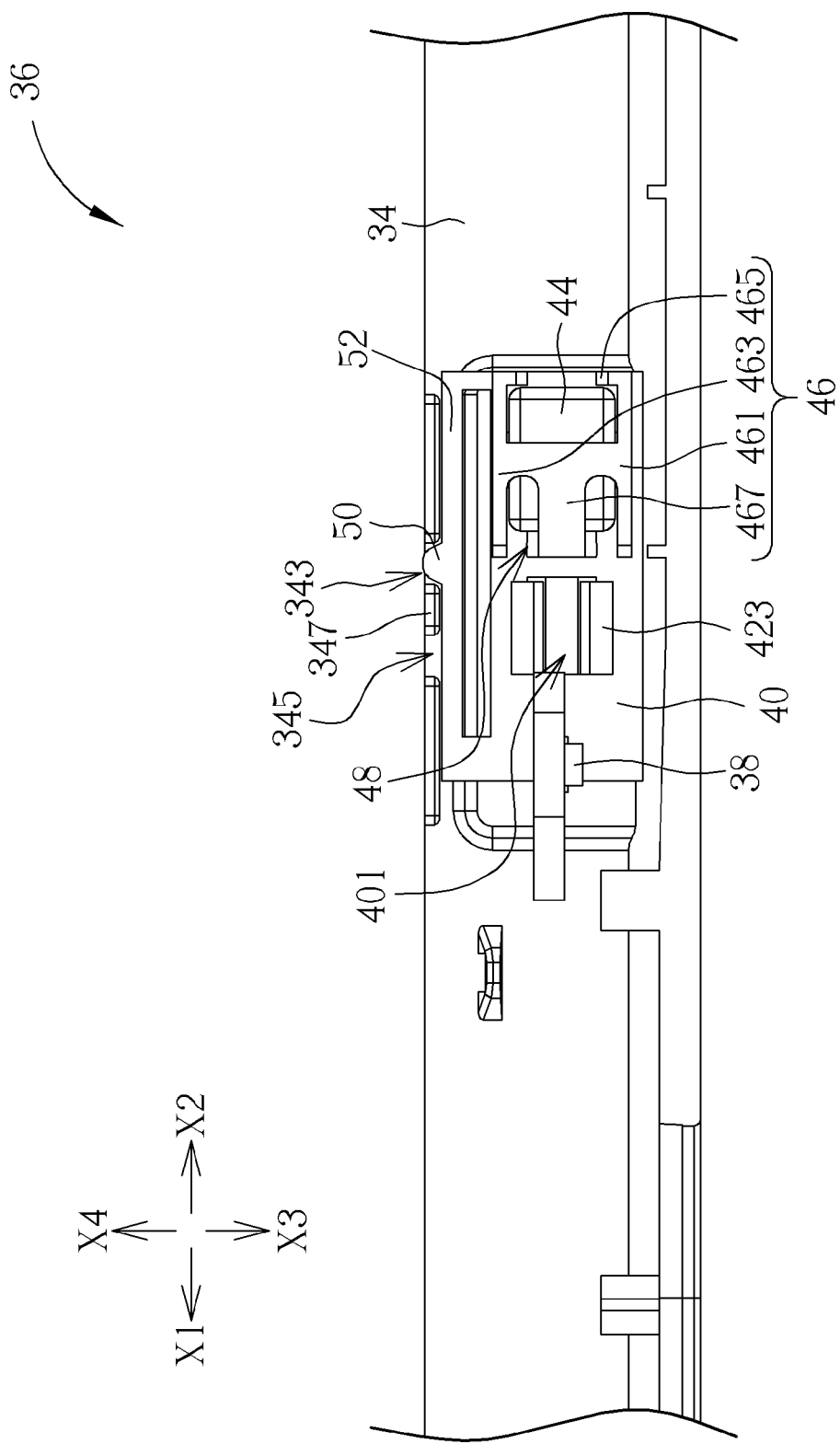
FIG. 7 is a diagram of the switch module in a non-activated status according to the embodiment of the present invention.
Figure 8:
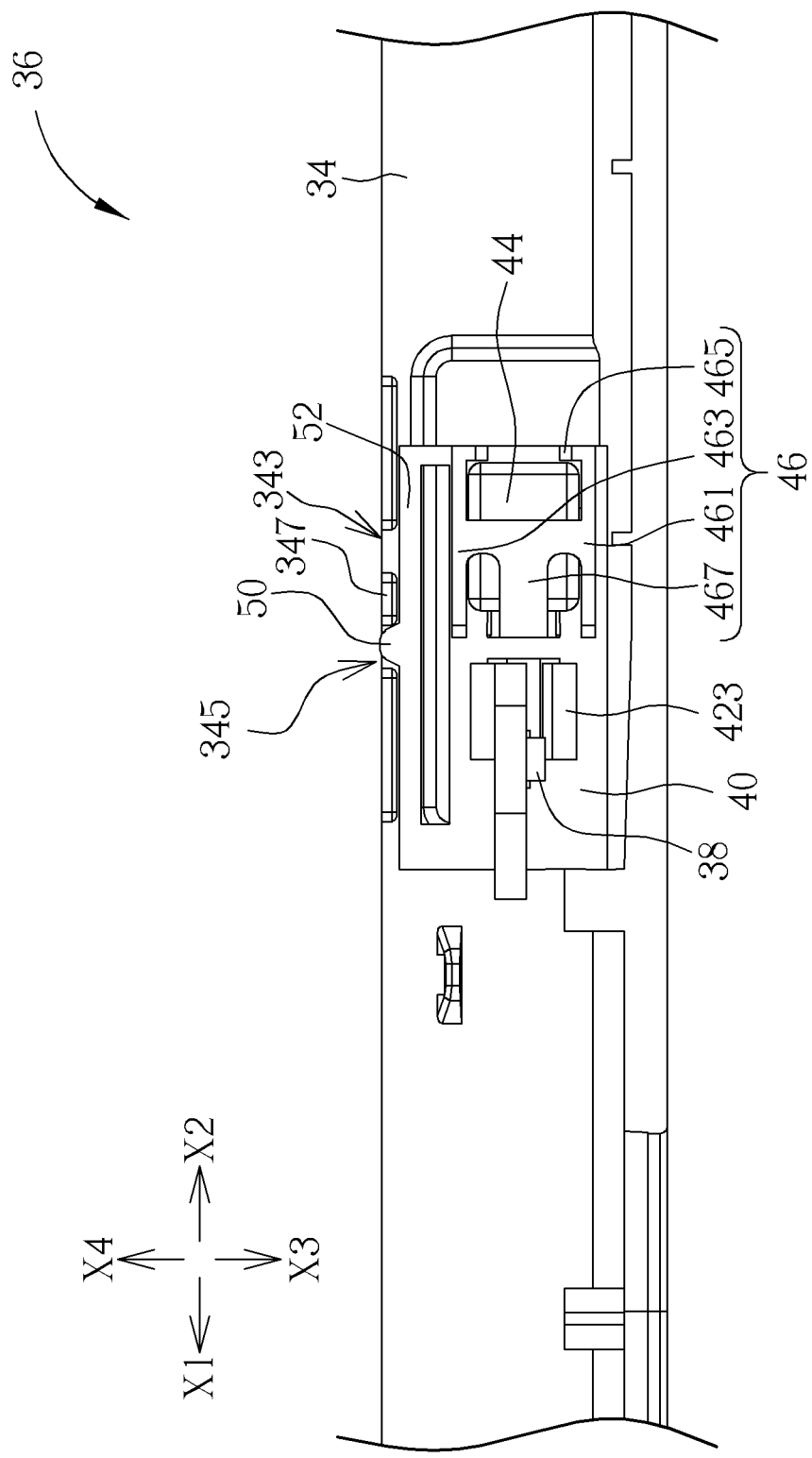
FIG. 8 is a diagram of the switch module in an activated status according to the embodiment of the present invention.

Please refer to FIG. 2, FIG. 7 and FIG. 8. FIG. 7 is a diagram of the switch module 36 in a non-activated status according to the embodiment of the present invention. FIG. 8 is a diagram of the switch module 36 in an activated status according to the embodiment of the present invention. As shown in FIG. 2, FIG. 7 and FIG. 8, the switch module 36 further includes an activating member 44 disposed on the sliding member 40. The activating member 44 is used for activating the hibernation switch 38 near the switch module 36, such that the hibernation switch 38 can activate the hibernation mode of the electronic device 30 for turning off the display module on the display casing 32 of the electronic device 30.

In this embodiment, the activating member 44 can be a magnetic member, such as a magnet, and the hibernation switch 38 can be a hall sensor. The hall sensor is used for sensing magnetic force generated by the magnetic member, so as to activate the hibernation mode of the electronic device 30. In addition, the switch module 36 further includes a fixing structure 46 disposed on the sliding member 40. The fixing structure 46 is used for fixing the activating member 44, i.e. the magnet, on the sliding member 40. Furthermore, the fixing structure 46 includes a first wall 461, a second wall 463, two third walls 465 and a hook member 467. The first wall 461, the second wall 463 and the hook member 467 protrude from the sliding member 40, and the hook member 467 is connected to the first wall 461 and the second wall 463. An amount of the third wall 465 is not limited to that mentioned in this embodiment, and it depends on practical demands.

As shown in FIG. 2, FIG. 7 and FIG. 8, the first wall 461 is used for stopping the activating member 44 from moving relative to the sliding member 40 in a third direction X3, and the second wall 463 is used for stopping the activating member 44 from moving relative to the sliding member 40 in a fourth direction X4. Since the first wall 461 and the second wall 463 abut against a lower side and an upper side of the activating member 44, the first wall 461 can prevent the activating member 44 from moving downwards relative to the sliding member 40, and the second wall 463 can prevent the activating member 44 from moving upwards relative to the sliding member 40. In other words, in this embodiment, the third direction X3 can be substantially perpendicular to the first direction X1 and the second direction X2, and the fourth direction X4 can be opposite to the third direction X3, as shown in FIG. 7 and FIG. 8.

Furthermore, the hook member 467 includes a hook portion 4671 and a connecting portion 4673. The connecting portion 4673 of the hook member 467 is connected to the hook portion 4671, the first wall 461 and the second wall 463 for preventing the activating member 44 from separating from the sliding member 40. The hook portion 4671 of the hook member 467 is used for hooking the activating member 44, so as to stop the activating member 44 from moving relative to the sliding member 40 in the first direction X1 or in the second direction X2 cooperatively with the third walls 465. In such a manner, the activating member 44 can constrain upward and downward movement of the activating member 44 by the first wall 461 and the second wall 463, constrain leftward and rightward movement of the activating member 44 by the hook portion 4671 of the hook member 467 and the third walls 465, and prevent the activating member 44 from separating from the sliding member 40 by the connecting portion 4673 of the hook member 467.

In practical application, the first wall 461, the second wall 463, the third walls 465 and the hook member 467 can be integrally formed with the sliding member 40 in an inject molding manner. Additionally, the switch module 36 further includes an opening structure 48 formed on the sliding member 40. In practical design of mold, the opening structure 48 is used for allowing core part of the mold to pass through, so as to prevent under cut issue when the hook member 467 is molded. A periphery of the opening structure 48 is respectively connected to the first wall 461, the second wall 463 and the third walls 465, and the periphery of the opening structure 48 abuts against the activating member 44. Accordingly, the periphery of the opening structure 48 can fix the activating member 44 on the sliding member 40 cooperatively with the first wall 461, the second wall 463, the third walls 465 and the hook member 467 of the fixing structure 46.

It should be noticed that structure of the fixing structure 46 for fixing the activating member 44 on the sliding member 40 is not limited to that mentioned in this embodiment. For example, the fixing structure 46 can be a twin adhesive, and the activating member 44 can be fixed on the sliding member 40 in a glued manner. In other words, the structures of the fixing structure 46 capable of fixing the activating member 44 on the sliding member 40 are within the scope of the present invention. As for which one of the aforesaid designs is adopted, it depends on practical demands.

As shown in FIG. 2, FIG. 7 and FIG. 8, the casing 34 includes a first constraining portion 343, a second constraining portion 345 and a protruding rib 347. The protruding rib 347 is located between the first constraining portion 343 and the second constraining portion 345. The switch module 36 further includes a protruding structure 50 and a resilient structure 52. The resilient structure 52 is resiliently connected to the sliding member 40 and the protruding structure 50. When the sliding member 40 is located in a non-activating position shown in FIG. 7, the protruding structure 50 is resiliently supported by the resilient structure 52 and thus engaged with the first constraining portion 343, such that the sliding member 40 can be fixed in the non-activating position. In the meanwhile, the activating member 44 on the sliding member 40 is incapable of activating the hibernation switch 38.

When the button body 421 of the push button 42 is pushed to slide the sliding member 40 in the first direction X1 from the non-activating position shown in FIG. 7 to an activation position shown in FIG. 8, the protruding structure 50 of the switch module 36 is constrained by the protruding rib 347 of the casing 34 first to push the resilient structure 52 of the switch module 36 downward. In the meanwhile, the resilient structure 52 is deformed and stores a resilient potential energy. When the protruding structure 50 moves with the sliding member 40 to the activating position, the protruding structure 50 aligns with the second constraining portion 345 of the casing 34. In the meanwhile, the resilient structure 52 releases the resilient potential energy and thus generates a resilient force for driving the protruding structure 50 to engage with the second constraining portion 345. Accordingly, the sliding member 40 can be fixed in the activating position, and the hibernation switch 38 near the switch module 36 can sense the magnetic force generated by the activating member 44 on the sliding member 40, so as to activate the hibernation mode of the electronic device 30.

In summary, when the sliding member 40 is fixed in the activating position, the activating member 44 on the sliding member 40 is capable of activating the hibernation switch 38 near the switch module 36. In such a manner, the hibernation switch 38 can activate the hibernation mode of the electronic device 30, so as to turn off the display module on the display cover 32 of the electronic device 30.

On the other hand, when the button body 421 of the push-button 42 is pushed to slide the sliding member 40 in the second direction X2 from the activating position shown in FIG. 8 to a non-activation position shown in FIG. 7, the protruding structure 50 of the switch module 36 is constrained by the protruding rib 347 of the casing 34 first to push the resilient structure 52 of the switch module 36 downward. In the meanwhile, the resilient structure 52 is deformed and stores the resilient potential energy. When the protruding structure 50 moves with the sliding member 40 to the non-activating position, the protruding structure 50 aligns with the first constraining portion 343 of the casing 34.

In the meanwhile, the resilient structure 52 releases the resilient potential energy and thus generates the resilient force for driving the protruding structure 50 to engage with the first constraining portion 343. Accordingly, the sliding member 40 can be fixed in the non-activating position, and the hibernation switch 38 near the switch module 36 can not sense the magnetic force generated by the activating member 44 on the sliding member 40. In summary, when the sliding member 40 is fixed in the non-activating position, the activating member 44 on the sliding member 40 is located in the non-activating position far away from the hibernation switch 38. Accordingly, the magnetic force generated by the activating member 44 is incapable of activating the hibernation switch 38.

Figure 9:
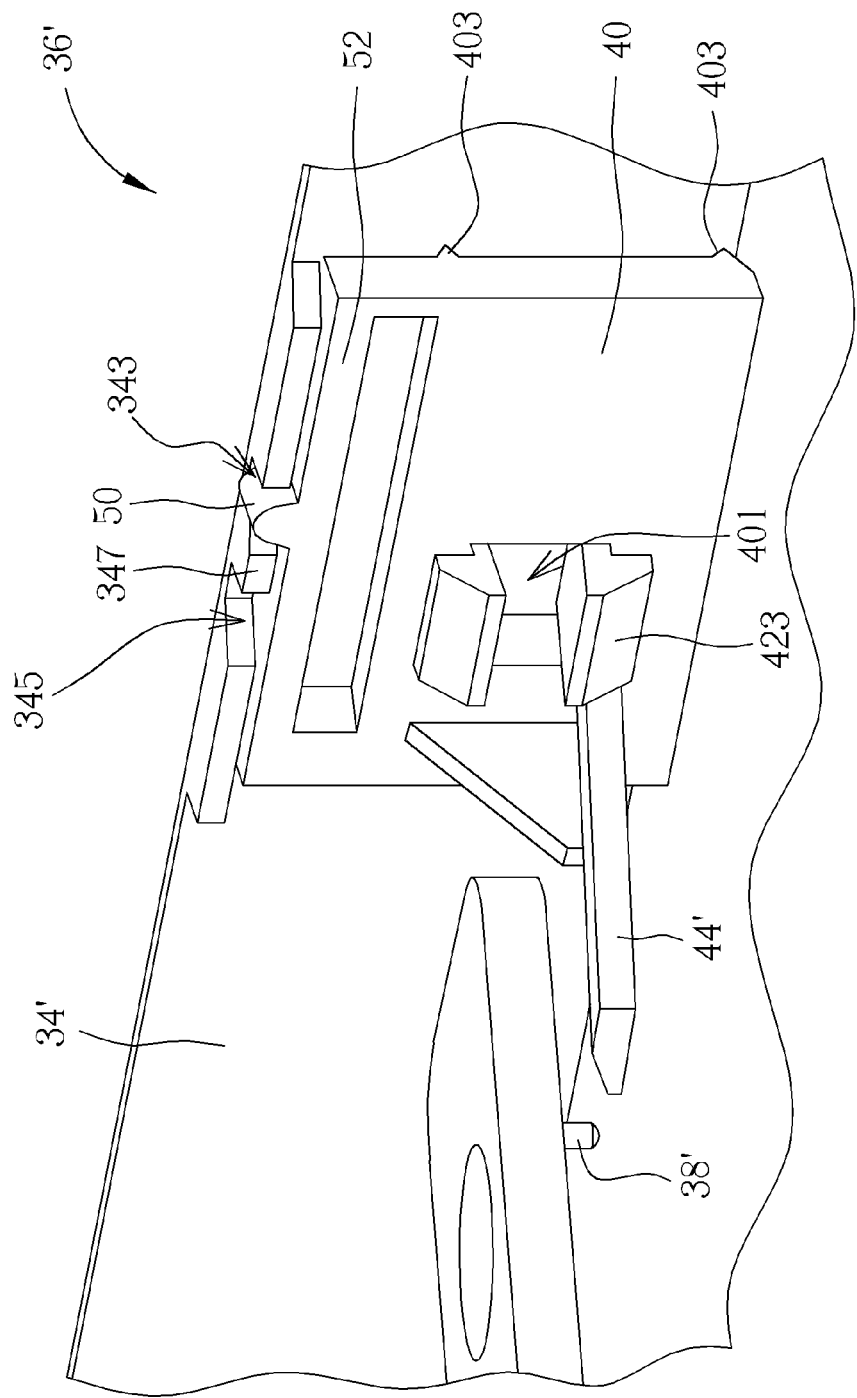
FIG. 9 is an assembly diagram of a switch module according to another embodiment of the present invention.

Please refer to FIG. 9 and FIG. 2. FIG. 9 is an assembly diagram of a switch module 36' according to another embodiment of the present invention. As shown in FIG. 9 and FIG. 2, the major difference between the switch module 36' and the aforesaid switch module 36 is that an activating member 44' of the switch module 36' is a protruding structure disposed on the sliding member 40. Additionally, a hibernation switch 38' of the switch module 36' is a contact switch. In this embodiment, the activating member 44' and the sliding member 40 can be, but not limited to, integrally formed. For example, the activating member 44' can be fixed on the sliding member 40 in a glued manner or in a melting manner. As for which one of the aforesaid designs is adopted, it depends on practical demands. In addition, since the activating member 44' and the sliding member 40 are integrally formed, the fixing structure 46 of the switch module 36' is omitted.

Figure 10:
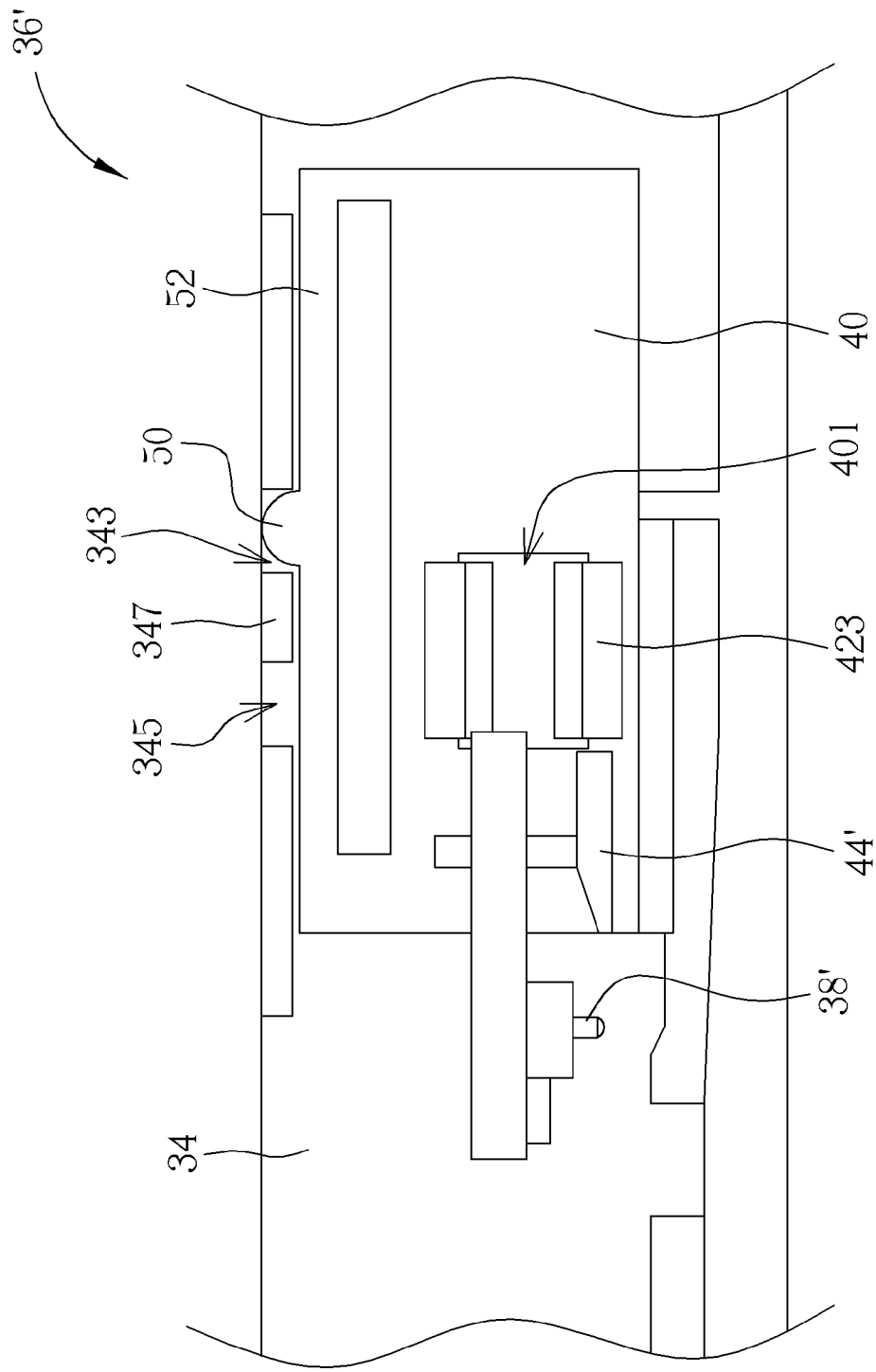
FIG. 10 is a diagram of the switch module in a non-activated status according to another embodiment of the present invention.
Figure 11:
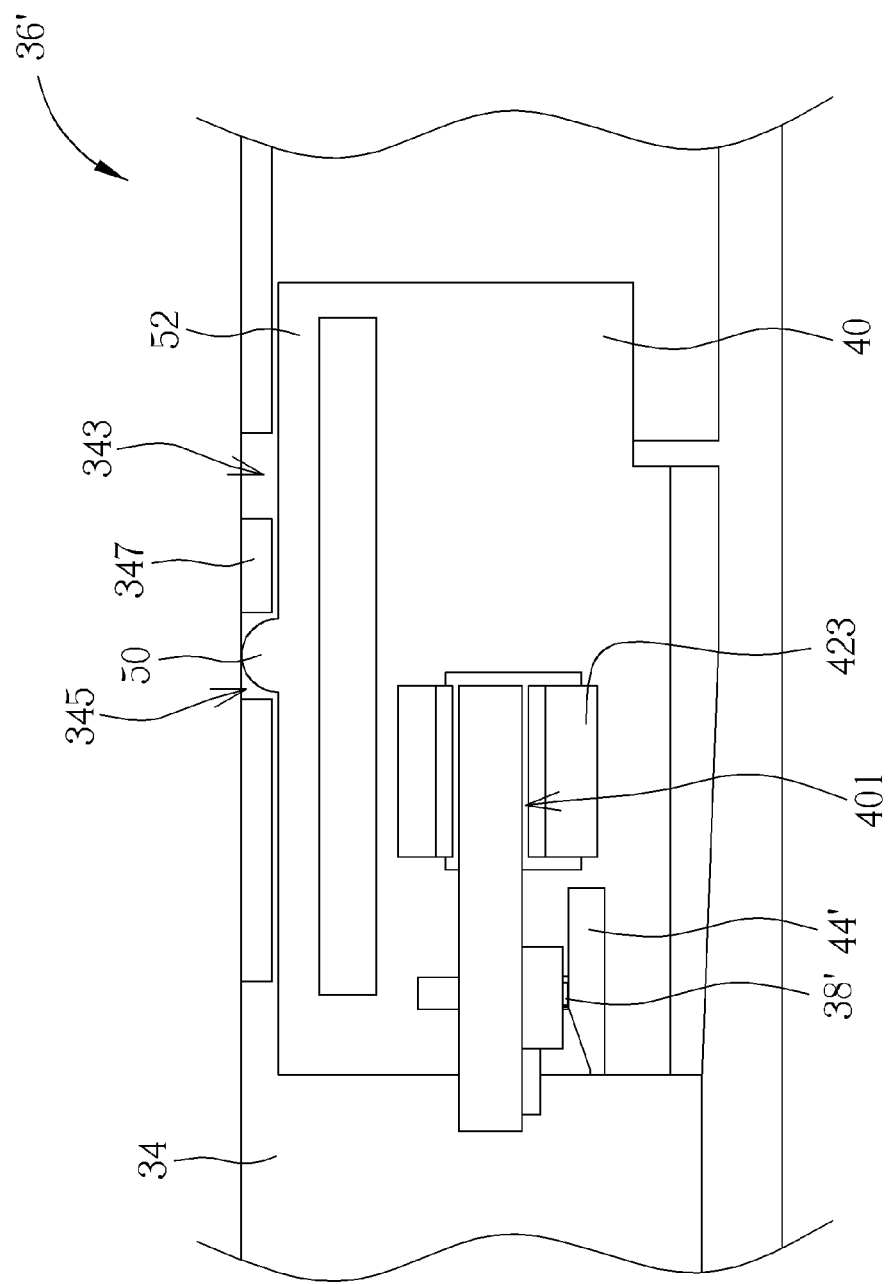
FIG. 11 is a diagram of the switch module in an activated status according to another embodiment of the present invention.

Please refer to FIG. 10 and FIG. 11. FIG. 10 is a diagram of the switch module 36' in a non-activated status according to another embodiment of the present invention. FIG. 11 is a diagram of the switch module 36' in an activated status according to another embodiment of the present invention. As shown in FIG. 10 and FIG. 11, when the button body 421 of the push button 42 is pushed to slide the sliding member 40 in the first direction X1 from a non-activating position shown in FIG. 10 to an activation position shown in FIG. 11, the activating member 44' pushes the hibernation switch 38'. In such a manner, the hibernation switch 38' can activate the hibernation mode of the electronic device 30, so as to turn off the display module on the display cover 32 of the electronic device 30.

On the other hand, when the button body 421 of the push-button 42 is pushed to slide the sliding member 40 in the second direction X2 from the activating position shown in FIG. 11 to the non-activation position shown in FIG. 10, the activating member 44' separates from the hibernation switch 38'. In summary, when the sliding member 40 is located in the non-activating position, the activating member 44' is incapable of activating the hibernation switch 38 since the activating member 44' separates from the hibernation switch 38'. The components in this embodiment with denotes identical to those in the aforesaid embodiment have the same structures and functions, and further description is omitted herein for simplicity.

Compared to the prior art, since the switch module of the present invention disposes the hibernation switch for activating the hibernation mode of the electronic device and the activating member for activating the hibernation switch inside the same casing, such as inside a host casing, the switch module of the present invention is not constrained by mechanical space of a display casing. In addition, the present invention utilizes the sliding member to move the activating member to the activating position for activating the hibernation switch. Since the sliding design of the sliding member is capable of moving the activating member to the activating position more precisely, the switch module of the present invention is capable of enhancing stability. When the hibernation mode of the electronic device is desired to be turned on, the push button is used for driving the sliding member to slide to the activation position, such that the activating member activates the hibernation switch. As a result, the switch module of the present invention is capable of enhancing convenience in use and flexibility of the product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch module for activating a hibernation mode of an electronic device, the electronic device comprising a casing and a hibernation switch installed inside the casing, at least one sliding slot with an orientation parallel to a first direction being formed on the casing, the switch module comprising:
    a sliding member disposed on an inner side of the casing in a slidable manner, an engaging slot being formed on the sliding member;
    a push button slidably disposed on an outer side of the casing and connected to the sliding member, the push button being for driving the sliding member to slide relative to the casing, the push button comprising:
        a button body slidably disposed on the outer side of the casing; and
        at least one engaging member connected to the button body and disposed through the at least one sliding slot, the at least one engaging member being for engaging the engaging slot on the sliding member and for driving the sliding member to slide relative to the casing in the first direction or in a second direction opposite to the first direction as sliding inside the at least one sliding slot;
    an activating member disposed on the sliding member for activating the hibernation switch when the push button drives the sliding member to slide to an activating position, so as to activate the hibernation mode of the electronic device; and
    a fixing structure disposed on the sliding member for fixing the activating member on the sliding member, the fixing structure comprising:
        a first wall protruding from the sliding member for stopping the activating member from moving relative to the sliding member in a third direction;
        a second wall protruding from the sliding member for stopping the activating member from moving relative to the sliding member in a fourth direction;
        a third wall protruding from the sliding member; and
        a hook member connected to the first wall and the second wall, the hook member and the third wall being cooperatively for stopping the activating member from moving relative to the sliding member in the first direction or in the second direction, the hook member being further for preventing the activating member from separating from the sliding member.

2. The switch module of claim 1, wherein the push button further comprises:
    a sliding rib disposed on the button body and slidably abutting against the casing.

3. The switch module of claim 1, wherein the casing comprises a first constraining portion and a second constraining portion, and the switch module further comprises:
    a protruding structure for selectively engaging the first constraining portion or the second constraining portion; and
    a resilient structure resiliently connected to the sliding member and the protruding structure for driving the protruding structure to engage the first constraining portion or the second constraining portion when the sliding member correspondingly slides relative to the casing to a non-activating position or to the activating position.

4. The switch module of claim 1, wherein the activating member is a magnetic member, and the hibernation switch is a hall sensor for sensing magnetic force generated by the magnetic member when the sliding member slides to the activating position, so as to activate the hibernation mode of the electronic device.

5. The switch module of claim 1, further comprising:
    an opening structure formed on the sliding member with a periphery respectively connected to the first wall, the second wall and the third wall, the periphery of the opening structure abutting against the activating member, so as to fix the activating member on the sliding member cooperatively with the fixing structure.

6. The switch module of claim 1, wherein the third direction is substantially perpendicular to the first direction and the second direction, and the fourth direction is opposite to the third direction.

7. The switch module of claim 1, wherein the activating member and the sliding member are integrally formed, the hibernation switch is a contact switch, and the activating member is for pressing the contact switch when the sliding member slides to the activating position, so as to activate the hibernation mode of the electronic device.

8. An electronic device, comprising:
    a casing, at least one sliding slot with an orientation parallel to a first direction being formed on the casing;
    a hibernation switch installed inside the casing for activating a hibernation mode of the electronic device; and
    a switch module for activating the hibernation switch, the switch module comprising:
        a sliding member disposed on an inner side of the casing in a slidable manner, an engaging slot being formed on the sliding member;
        a push button slidably disposed on an outer side of the casing and connected to the sliding member, the push button being for driving the sliding member to slide relative to the casing, the push button comprising:
            a button body slidably disposed on the outer side of the casing; and
            at least one engaging member connected to the button body and disposed through the at least one sliding slot, the at least one engaging member being for engaging the engaging slot on the sliding member and for driving the sliding member to slide relative to the casing in the first direction or in a second direction opposite to the first direction as sliding inside the at least one sliding slot;
        an activating member disposed on the sliding member for activating the hibernation switch when the push button drives the sliding member to slide to an activating position, so as to activate the hibernation mode of the electronic device; and
        a fixing structure disposed on the sliding member for fixing the activating member on the sliding member, the fixing structure comprising:

a first wall protruding from the sliding member for stopping the activating member from moving relative to the sliding member in a third direction;

a second wall protruding from the sliding member for stopping the activating member from moving relative to the sliding member in a fourth direction;

a third wall protruding from the sliding member; and a hook member connected to the first wall and the second wall, the hook member and the third wall being cooperatively for stopping the activating member from moving relative to the sliding member in the first direction or in the second direction, the hook member being further for preventing the activating member from separating from the sliding member.

9. The electronic device of claim 8, wherein the push button further comprises:

a sliding rib disposed on the button body and slidably abutting against the casing.

10. The electronic device of claim 8, wherein the casing comprises a first constraining portion and a second constraining portion, and the switch module further comprises:

a protruding structure for selectively engaging the first constraining portion or the second constraining portion; and a resilient structure resiliently connected to the sliding member and the protruding structure for driving the protruding structure to engage the first constraining portion or the second constraining portion when the sliding member correspondingly slides relative to the casing to a non-activating position or to the activating position.

11. The electronic device of claim 8, wherein the activating member is a magnetic member, and the hibernation switch is a hall sensor for sensing magnetic force generated by the magnetic member when the sliding member slides to the activating position, so as to activate the hibernation mode of the electronic device.

12. The electronic device of claim 8, wherein the switch module further comprises:

an opening structure formed on the sliding member with a periphery respectively connected to the first wall, the second wall and the third wall, the periphery of the opening structure abutting against the activating member, so as to fix the activating member on the sliding member cooperatively with the fixing structure.

13. The electronic device of claim 8, wherein the third direction is substantially perpendicular to the first direction and the second direction, and the fourth direction is opposite to the third direction.

14. The electronic device of claim 8, wherein the activating member and the sliding member are integrally formed, the hibernation switch is a contact switch, and the activating member is for pressing the contact switch when the sliding member slides to the activating position, so as to activate the hibernation mode of the electronic device.

* * * * *